United States Patent
Pei (10) Patent No.: US 11,239,615 B2
(45) Date of Patent: Feb. 1, 2022

(54) POWER SUPPLY SOCKET, POWER RECEIVING HEAD, DISPLAY DEVICE, POWER SUPPLY DEVICE AND POWER SUPPLY METHOD THEREOF

(71) Applicant: BOE TECHNOLOGY GROUP CO., LTD., Beijing (CN)

(72) Inventor: Hongyan Pei, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 42 days.

(21) Appl. No.: 16/772,090

(22) PCT Filed: Mar. 22, 2019

(86) PCT No.: PCT/CN2019/079279
§ 371 (c)(1),
(2) Date: Jun. 11, 2020

(87) PCT Pub. No.: WO2020/191526
PCT Pub. Date: Oct. 1, 2020

(65) Prior Publication Data
US 2021/0210910 A1 Jul. 8, 2021

(51) Int. Cl.
*H01H 3/00* (2006.01)
*H01R 13/703* (2006.01)
(Continued)

(52) U.S. Cl.
CPC ..... *H01R 13/7036* (2013.01); *H01R 13/6683* (2013.01); *H01R 13/6691* (2013.01);
(Continued)

(58) Field of Classification Search
CPC ........ H01H 9/542; H01H 9/54; H01H 33/596; H01H 9/56; H01H 9/42
(Continued)

(56) References Cited

U.S. PATENT DOCUMENTS 7,575,467 B2 * 8/2009 Ferguson ............... H01R 24/78
439/489
8,152,554 B2 4/2012 Chapel et al.
(Continued)

FOREIGN PATENT DOCUMENTS

CN 103875134 A 6/2014
CN 106848754 A 6/2017
(Continued)

OTHER PUBLICATIONS

First Office Action for CN Patent Application No. 201980000357.0 dated Jun. 23, 2021.
(Continued)

*Primary Examiner* — Phuong Chi Thi Nguyen
(74) *Attorney, Agent, or Firm* — Thomas | Horstemeyer, LLP (57) ABSTRACT

The present disclosure provides a power supply socket and a power receiving head. The socket includes a power supply socket housing, a conductive member, a switching element, and a control component. The conductive member is provided in the power supply socket housing and can be connected to a conductive portion on a power receiving head. The switching element is provided in the housing and has an output end and a control end, the output end of the switching element is connected to the conductive member. The control component is provided in the housing and connected to the control end of the switching element, and is configured to detect the power receiving head, and control the switching element to be turned on when the power receiving head is detected, and control the switching element to be turned off when the power receiving head is not detected.

17 Claims, 6 Drawing Sheets

(51) Int. Cl.
*H01R 13/66* (2006.01)
*H01R 13/717* (2006.01)
*H01R 13/72* (2006.01)
*H03K 19/20* (2006.01)

(52) U.S. Cl.
CPC ........... *H01R 13/717* (2013.01); *H01R 13/72* (2013.01); *H03K 19/20* (2013.01)

(58) Field of Classification Search
USPC ...................................................... 361/2–13
See application file for complete search history.

(56) References Cited

U.S. PATENT DOCUMENTS

| | | | | |
|---|---|---|---|---|
| 8,435,055 | B1 * | 5/2013 | Bhosale | H01R 13/4534 439/145 |
| 8,550,829 | B2 * | 10/2013 | Huang | H01R 13/4534 439/145 |
| 9,048,559 | B2 * | 6/2015 | Huang | H01R 13/4534 |
| 9,681,241 | B2 * | 6/2017 | Poulsen | H04R 29/001 |
| 9,877,126 | B2 * | 1/2018 | Poulsen | H04R 29/001 |
| 11,011,877 | B2 * | 5/2021 | Sandel | H01R 13/44 |
| 11,017,969 | B1 * | 5/2021 | Hellmers | H01H 71/08 |
| 2005/0095908 | A1 | 5/2005 | Xue et al. | |
| 2010/0144187 | A1 | 6/2010 | Chapel et al. | |

FOREIGN PATENT DOCUMENTS

| | | |
|---|---|---|
| CN | 107404051 A | 11/2017 |
| CN | 207009740 U | 2/2018 |
| CN | 108054582 A | 5/2018 |
| CN | 106848754 B | 7/2018 |
| CN | 108054582 B | 12/2018 |
| EP | 2240983 | 9/2009 |
| EP | 2240983 A1 | 10/2010 |
| EP | 2240983 B1 | 4/2019 |
| EP | 3540868 A1 | 9/2019 |
| HK | 1244356 | 10/2017 |
| HK | 1244356 | 8/2018 |
| WO | 2011038395 A1 | 3/2011 |

OTHER PUBLICATIONS

International Search Report and Written Opinion for International Application No. PCT/CN2019/079279 dated Dec. 18, 2019.

* cited by examiner

POWER SUPPLY SOCKET, POWER RECEIVING HEAD, DISPLAY DEVICE, POWER SUPPLY DEVICE AND POWER SUPPLY METHOD THEREOF

CROSS-REFERENCE TO RELATED APPLICATIONS

This application is a § 371 national phase application based on, and claims priority to, International Application No. PCT/CN2019/079279, filed Mar. 22, 2019, the contents of which being incorporated by reference in its entirety herein.

TECHNICAL FIELD

The present disclosure relates to display technologies, and in particular, to a power supply socket, a power receiving head, a power supply device, a power supply method, and a display device.

BACKGROUND

With advancements of display technologies in reducing the thickness and weight of display devices, more and more display devices are mounted by means of wall mounting.

A wall-mounted display device needs to be connected to an external power source through a power supply line during use or charging.

SUMMARY

An objective of the present disclosure is to provide a power supply socket, a power receiving head, a power supply device, a power supply method, and a display device.

According to a first aspect of the present disclosure, there is provided a power supply socket, including:

a power supply socket housing;

a conductive member provided in the power supply socket housing and connectable with a conductive portion on a power receiving head;

a switching element provided in the power supply socket housing and having an output end and a control end, wherein the output end of the switching element is connected to the conductive member; and a control component provided in the power supply socket housing and connected to the control end of the switching element, and configured to detect the power receiving head, and control the switching element to be turned on when the control component detects the power receiving head, and control the switching element to be turned off when the control component does not detect the power receiving head.

In an exemplary embodiment of the present disclosure, the control component includes:

a light detector configured to output a first detection signal when detection light emitted from the power receiving head is received, and output a second detection signal the detection light emitted from the power receiving head is not detected;

a control circuit connected to an output end of the light detector and the control end of the switching element, and configured to control the switching element to be turned on according to the first detection signal, and control the switching element to be turned off according to the second detection signal.

In an exemplary embodiment of the present disclosure, the control component further includes:

a magnet provided in the power supply socket housing and configured to generate a magnetic field, wherein the power receiving head is configured for responding to the magnetic field and the magnetic field causes the power receiving head to emit the detection light.

In an exemplary embodiment of the present disclosure, the control component includes:

a limit switch provided in the power supply socket housing and configured to output a third detection signal when the power receiving head is detected, and output a fourth detection signal when the power receiving head is not detected; and a control circuit connected to an output end of the limit switch and the control end of the switching element, and configured to control the switching element to be turned on according to the third detection signal, and control the switching element to be turned off according to the fourth detection signal.

In an exemplary embodiment of the present disclosure, the control component further includes:

a limit switch provided in the power supply socket housing and configured to output a third detection signal when the power receiving head is detected, and output a fourth detection signal when the power receiving head is not detected;

the control circuit is further connected to an output end of the limit switch, and is configured to control the switching element to be turned on according to the first detection signal and the third detection signal, and control the switching element to be turned off according to the second detection signal and the fourth detection signal.

In an exemplary embodiment of the present disclosure, the control circuit includes an AND gate circuit. A first input end of the AND gate circuit is configured to receive the first detection signal or the second detection signal. A second input end of the AND gate circuit is configured to receive the third detection signal or the fourth detection signal, and an output end of the AND gate circuit is connected to the control end of the switching element;

The AND gate circuit is configured to control the switching element to be turned on when receiving the first detection signal and the third detection signal simultaneously.

In an exemplary embodiment of the present disclosure, the power supply socket housing has a power supply socket slot for inserting the power receiving head;

the light detector, the conductive member, and the limit switch are disposed in the power supply socket slot.

In an exemplary embodiment of the present disclosure, the light detector is disposed on a side wall of the power supply socket slot.

In an exemplary embodiment of the present disclosure, when the power supply socket is mated with the power receiving head, the conductive member is located between the limit switch and the power receiving head.

According to a second aspect of the present disclosure, a power receiving head is provided for mating with the power supply socket described above. The power receiving head includes:

a power receiving head housing;

a conductive portion provided in the power receiving head housing, and connectable to a conductive member on the power supply socket.

In an exemplary embodiment of the present disclosure, when the power supply socket has a light detector, the power receiving head further includes:

a light emitter provided in the power receiving head housing and configured to emit detection light receivable by the light detector.

In an exemplary embodiment of the present disclosure, when the power supply socket has a magnet, the power receiving head further includes:

a magnetic field detector provided in the power receiving head housing and connected to the light emitter, and configured to control the light emitter to emit light when a magnetic field generated by the magnet is detected, and control the light emitter not to emit light when a magnetic field generated by the magnet is not detected.

In an exemplary embodiment of the present disclosure, when the power supply socket has a limit switch, the power receiving head is configured to be in contact with the limit switch.

In an exemplary embodiment of the present disclosure, when the power supply socket has a power supply socket slot, and the light detector is disposed on a side wall of the power supply socket slot, the power receiving head housing is at least partially insertable into the power supply socket slot; and the power receiving head housing has a mating surface that mates with a side wall of the power supply socket slot where the light detector is provided; the light emitter is disposed on the mating surface.

According to a third aspect of the present disclosure, a power supply device is provided, and the charging device includes:

the power supply socket described above;
the power receiving head described above;
a wire connected to a conductive portion of the power receiving head; and
a wire retractable mechanism configured to retract or release the wire, wherein the power receiving head is in contact with the power supply socket when the wire is released, so that the conductive portion is connected with the conductive member.

According to a fourth aspect of the present disclosure, a power supply method is provided, applied to the power supply device described above, and the power supply method includes:

controlling the wire retractable mechanism to release the wire when supplying of power is required, so that the conductive member of the power supply socket is connected to the conductive portion of the power receiving head;

controlling the wire retractable mechanism to retract the wire when supplying of power is not required, so that the conductive member of the power supply socket is separated from the conductive portion of the power receiving head.

According to a fifth aspect of the present disclosure, there is provided a display device including the power supply device described above.

According to a fifth aspect of the present disclosure, there is provided a picture screen including a display panel and the power supply device described above; the display panel has a light emitting surface, and a wire retractable mechanism of the power supply device is disposed on a side of the display panel away from the light emitting surface.

BRIEF DESCRIPTION OF THE DRAWINGS

The above and other features and advantages of the present disclosure will become more apparent by describing example embodiments in detail with reference to the accompanying drawings.

DETAILED DESCRIPTION

Example embodiments will now be described more fully with reference to the accompanying drawings. However, the embodiments can be implemented in a variety of forms and should not be construed as being limited to the examples set forth herein; rather, these embodiments are provided so that The present disclosure will be more complete so as to convey the idea of the exemplary embodiments to those skilled in this art. The described features, structures, or characteristics in one or more embodiments may be combined in any suitable manner. In the following description, many specific details are provided to give a full understanding of the embodiments of the present disclosure.

When a structure is "on" another structure, it may mean that a structure is integrally formed on another structure, or that a structure is "directly" disposed on another structure, or that a structure is "indirectly" disposed on another structure through other structures. The terms "one" and "a" are used to indicate that there are one or more elements/components or the like; the terms "include", "contain", and "have" are used to indicate an open type meaning of including and means that there may be additional elements/components/etc. in addition to the listed elements/components/etc.

Reference numerals of main components in the figures are described as follows: power supply socket 1; power supply socket housing 11; power supply socket slot 110; bottom of slot 111; side wall 112; conductive member 12; switching element 13; control component 14; light detector 141; control circuit 142; AND gate circuit 1421; magnet 143; limit switch 144; power receiving head 2; power receiving head housing 21; mating surface 211; end surface 212; wire 3; wire retractable mechanism 4; external power supply 5; display panel 6; support wall 7; and connecting parts 8.

Figure 1:
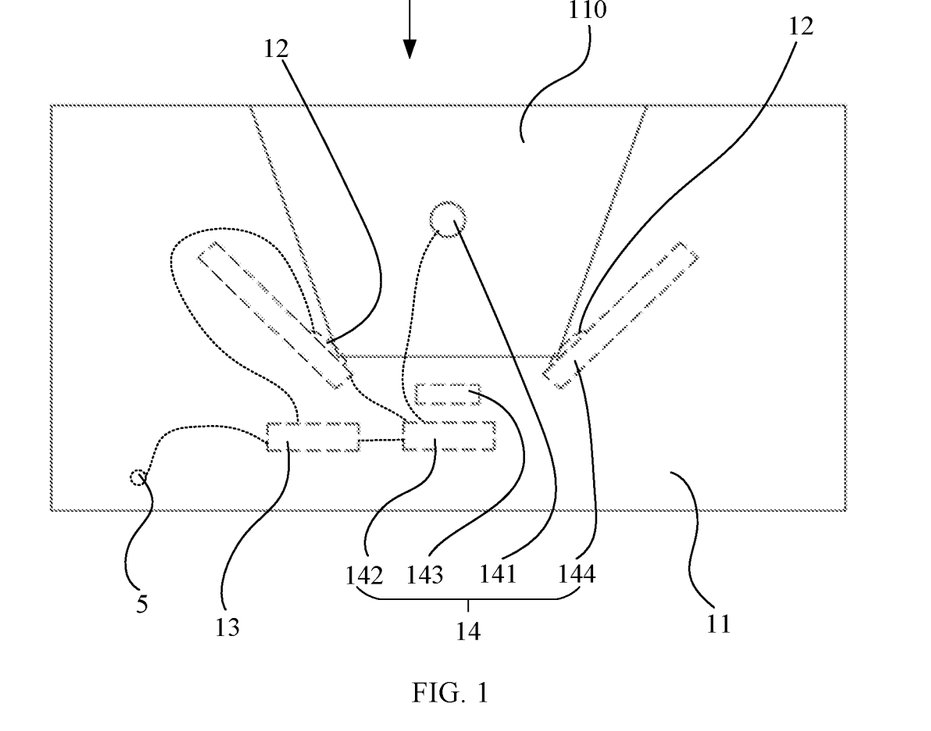
FIG. 1 is a schematic front view of a power supply socket according to an embodiment of the present disclosure.

An embodiment of the present disclosure provides a power supply socket 1. As shown in FIG. 1, the power supply socket 1 includes a power supply socket housing 11, a conductive member 12, a switching element 13, and a control component 14.

The conductive member 12 is provided in the power supply housing 11 and can be connected to a conductive portion on a power receiving head. The switching element 13 is provided in the power supply housing 11 and has an output end and a control end. The output end of the switching element 13 is connected to the conductive member 12. The control component 14 is provided in the power supply housing 11 and is connected to the control end of the switching element 13 for detecting the power receiving head 2. The control switching element 13 is turned on when the control component 14 detects the power receiving head 2, and the control switching element 13 is turned off when the control unit 14 does not detect the power receiving head 2.

In the power supply socket 1 provided by the present disclosure, an input end of the switching element 13 is configured to be connected to an external power source 5. When the control unit 14 detects the power receiving head, the control switching element 13 is turned on so that a voltage of the external power source 5 is applied to the conductive member 12. At this time, if the conductive member 12 is connected to the conductive portion, the power receiving head is connected to the external power source 5. When the control unit 14 does not detect the power receiving head 2, the control switch is turned off so that the external power source 5 and the conductive member 12 are disconnected, thereby avoiding an electric shock caused by accidentally touching the conductive member 12. Therefore, the power supply socket 1 of the present disclosure can realize power supplying when mated with the power receiving head 2, and can stop providing electricity power when the conductive member 12 is exposed due to the separation with the power receiving head, thereby reducing the risk of accidental electric shock.

The following describes in detail the components of the power supply socket 1 provided in the embodiments of the present disclosure with reference to the drawings.

In an embodiment, as shown in FIG. 1, the power supply housing 11 may have a control cavity, and the switching element 13 may be disposed in the control cavity to avoid exposing the switching element 13.

The conductive member 12 may be disposed on the surface of the power supply socket housing 11 or protrude from the surface of the power supply socket housing 11 to facilitate the connection and separation between the conductive portion and the conductive member 12.

In an embodiment, as shown in FIG. 1, when the power supply socket housing 11 is installed, the upper portion of the conductive member 12 can be prevented from being blocked by the power supply socket housing 11. As such, the conductive portion can realize the connection and separation with the conductive member 12 by moving up and down, so that the conduction and disconnection of the power supply socket 1 and the power receiving head 2 become easier and more convenient.

Figure 6:
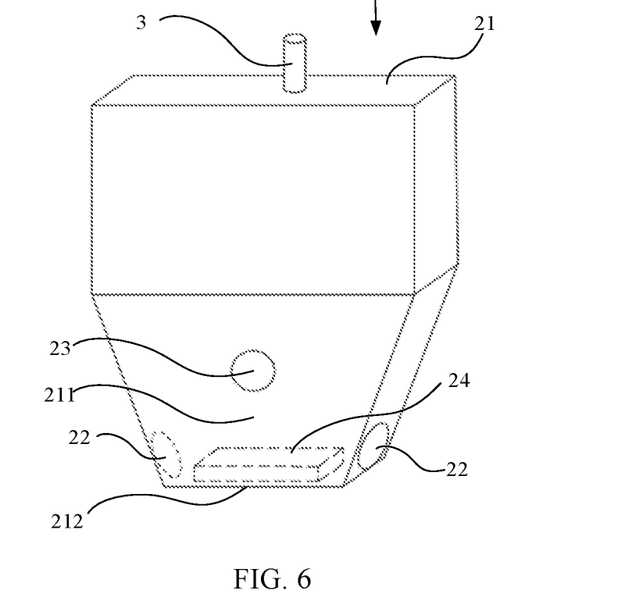
FIG. 6 is a schematic structural diagram of a power receiving head according to an embodiment of the present disclosure.
Figure 8:
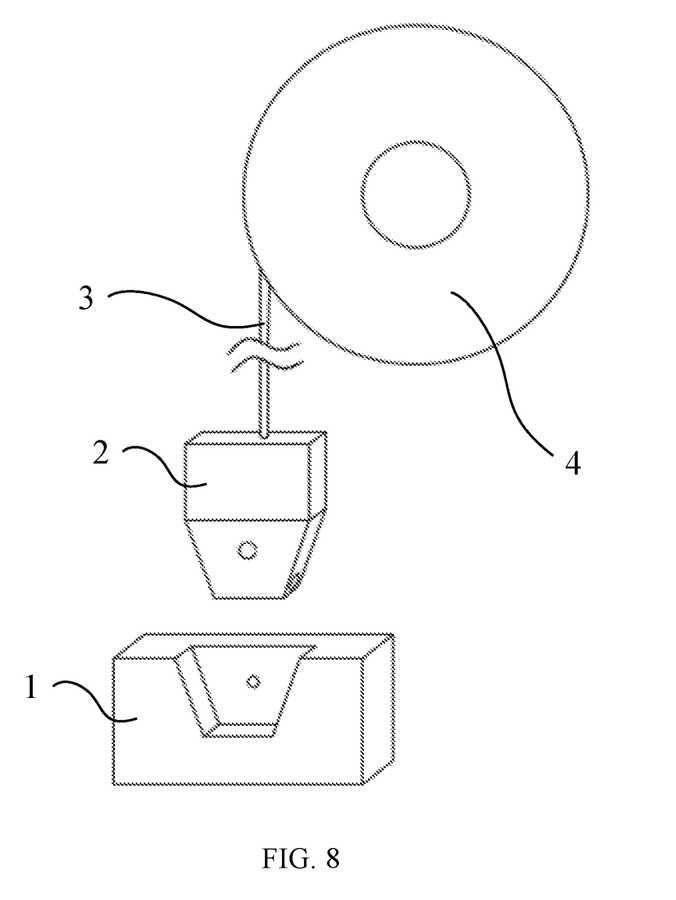
FIG. 8 is a schematic structural diagram of a power supply device according to an embodiment of the present disclosure.

For example, as shown in FIG. 8, the power supply socket 1 can mate with the power receiving head 2. As shown in FIG. 6, the power receiving head 2 may include a power receiving head housing 21 and a conductive portion 22. The power receiving head housing 21 is configured to be disposed above the power supply socket 1, and the conductive portion 22 is provided in the power receiving head housing 21, and can be connected to the conductive member 12 in the power supply socket 1 under the action of gravity. As such, when the power receiving head housing 21 drives the conductive portion 22 to move downward under the action of gravity, the conductive portion 22 can move to contact and connect with the conductive member 12; at this time, the control component 14 can detect the power receiving head 2 and control the switching element 13 to be turned on, and the power supply socket 1 supplies power to the power receiving head 2. When the power receiving head housing 21 is moved upward by receiving an upward pulling force, the power receiving head housing 21 drives the conductive portion 22 to move upward to be separated from the conductive member 12, so that the power supply socket 1 is separated from the power receiving head 2 are separated; at this time, the control component 14 controls the switching element 13 to be turned off, so that the power supply socket 1 stops providing electricity power.

The conductive member 12 may be in a strip shape, a sheet shape, a spiral wire shape, or other shapes. As long as the conductive member 12 can be effectively contacted with the conductive portion 22, the shape of the conductive member 12 is not specifically limited in the present disclosure.

The may be one or more conductive members 12, and each of the conductive members 12 is respectively connected to a power supply circuit of an external power source 5. In one embodiment, the there is one conductive member 12, and correspondingly, accordingly there is one conductive portion 22 on the power receiving head 2. In another embodiment, as shown in FIG. 1, the number of the conductive members 12 is two and insulated from each other; accordingly, the number of the conductive portions 22 on the power receiving head 2 is also two and insulated from each other. The two conductive members 12 and the two conductive portions 22 can be connected in a one-to-one correspondence.

The switching element 13 is configured to be turned on or off under the control of the control component 14, and an input end of the switching element 13 is configured to be connected to an external power source 5. In an embodiment, the switching element 13 may be a relay. The relay can be a mechanical relay (such as an electromagnetic relay or a reed relay), a solid state relay, or other types of relays. In another embodiment, the switching element 13 may be a semiconductor switch. The semiconductor switch may be a triode, an insulated gate bipolar transistor, or other semiconductor switches.

The control component 14 may include a detection device and a control circuit 142. The detection device is connected to the input end of the control circuit 142, and the output end of the control circuit 142 is connected to the control end of the switching element 13. The detection device is configured to detect the power receiving head 2 and send the detection result to the control circuit 142. The control circuit 142 controls the switching element 13 to be turned on or off according to the received detection result. There may be one or more detection devices. When there are more than one detection devices, the types of the plurality of detection devices may be the same or different, and the present disclosure does not specifically limit this.

For example, in an embodiment, the control component 14 may include a control circuit 142 and a light detector 141 used as the detection device. The light detector 141 is configured to output a first detection signal when receiving the detection light emitted from the power receiving head 2, and is configured to output a second detection signal when not receiving the detection light emitted from the power receiving head 2. The control circuit 142 is connected to the output end of the light detector 141 and the control end of the switching element 13, and is configured to control the switching element 13 to be turned on according to the first detection signal, and control the switching element 13 to be turned off according to the second detection signal. As such, the control component 14 can detect the power receiving head 2 by detecting the detection light. Compared with the solution for detecting the power receiving head 2 by detecting whether the power receiving head 2 blocks the ambient light, the solution of the present disclosure can not only get rid of the dependence on the ambient light, but also reduce the danger that the power supply socket 1 is powered on caused by accidentally blocking the ambient light.

It can be understood that the power receiving head 2 mated with the power supply socket 1 may have a function of emitting detection light. As shown in FIG. 6, the power receiving head 2 may further include a light emitter 23 provided in the power receiving head housing 21 and configured to emit detection light that can be received by the light detector 141. The light emitting device 23 may be a light emitting device of various types, as long as the emitted light can be detected by the light detector 141.

In one embodiment, the light detector 141 includes an infrared light receiver for receiving infrared rays. Correspondingly, the light emitter 23 may be an infrared transmitter for emitting infrared rays as the detection light. In another embodiment, the light detector 141 includes a laser receiver for receiving laser light. Correspondingly, the light emitter 23 may be a laser transmitter for emitting laser light as the detection light. Of course, the detection light may also be visible light or light of other types. Correspondingly, the light emitter 23 is provided as a light emitting device configured for emitting the detection light, and the light detector 141 is also correspondingly provided as a light detection device configured for receiving the detection light. The present disclosure does not specifically limit this.

The light detector 141 may include a photoelectric element for converting a light signal of the detection light into an electrical signal. When the detection light emitted by the power receiving head 2 is irradiated to the photoelectric element, the photoelectric element will generate a detection current or a detection voltage, so that the light detector 141 emits the first detection signal. When the photoelectric element is not irradiated with the detection light emitted from the power receiving head, the photoelectric element will not generate the detection current or the detection voltage, so that the light detector 142 outputs the second detection signal. The photoelectric element may include a photoresistor, a PIN photodiode, or other photoelectric elements, which are not specifically limited in the present disclosure.

According to an exemplary embodiment, as shown in FIG. 1, the control component 14 may further include a magnet 143 provided in the power supply housing 11 to generate a magnetic field. The power receiving head 2 can respond to the magnetic field and the magnetic field can cause the power receiving head 2 to emit the detection light. The magnet 143 may be a magnet, an electromagnet, or other devices configured for generating the magnetic field, which is not particularly limited in the present disclosure.

Figure 7:
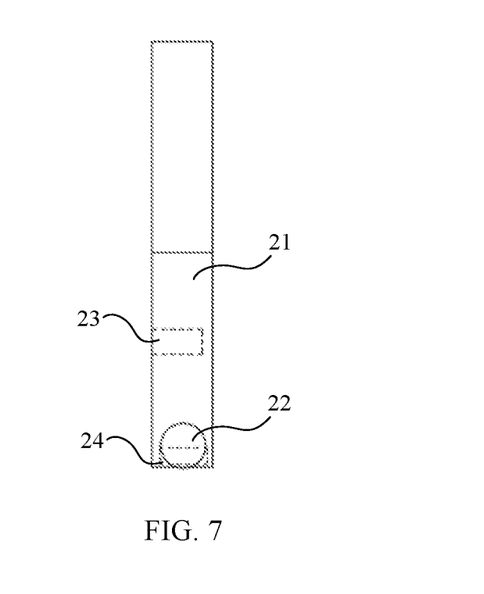
FIG. 7 is a schematic side structural view of a power receiving head according to an embodiment of the present disclosure.

It can be understood that the power receiving head 2 mated with the power supply socket 1 needs to have a function of responding to the magnetic field and emitting the detection light when the magnetic field is detected. As shown in FIGS. 6 and 7, the power receiving head 2 may further include a magnetic field detector 24. The magnetic field detector 24 is provided in the power receiving head housing 21 and is connected to the light emitter 23. The magnetic field detector 24 is configured to control the light emitter 23 to emit light upon detection of the magnetic field generated by the magnet 143, and control the light emitter 23 not to emit light if the magnetic field generated by the magnet 143 is not detected. In this way, when the power receiving head 2 is far away from the power supply socket 1, the magnetic field detector 24 cannot detect the magnetic field generated by the magnet 143, so the light emitter 23 does not emit light, thereby reducing the power consumption and extending the service life of the light emitter 23. When the power receiving head 2 is close to the power supply socket 1, the magnetic field detector 24 can control the light emitter 23 to emit light after detecting the magnetic field of the magnet 143, thereby ensuring that the light emitter 23 can provide the detection light in time.

In one embodiment, the magnetic field detector 24 outputs a light emitting signal to the light emitter 23 when the detected magnetic field is greater than a set value, and the light emitter 23 emits light in response to the light emitting signal; the magnetic field detector 24 does not send the light emitting signal to the light emitter 23 when the detected magnetic field is not greater than the set value, and the light emitter 23 does not emit light because the light emitting signal is not received. The magnetic field detector 24 may include a magnetic switch, a Hall sensor, or other devices configured for detecting the magnetic field, which is not specifically limited in the present disclosure.

Figure 4:
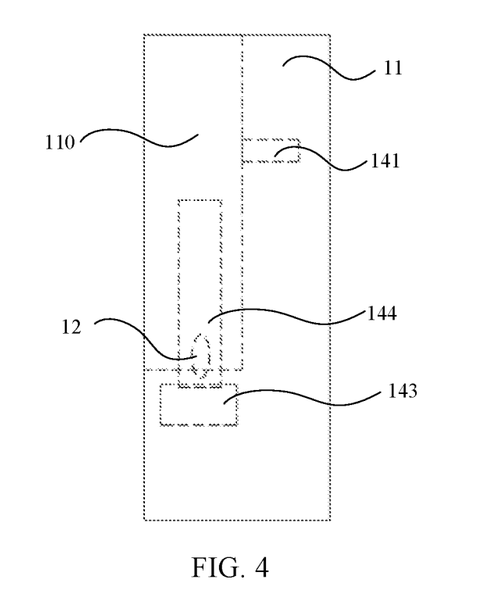
FIG. 4 is a schematic side structural view of a power supply socket housing according to an embodiment of the present disclosure.

In another embodiment, as shown in FIG. 1 and FIG. 4 (the switching element is not shown), the control component 14 may include a control circuit 142 and a limit switch 144 used as the detection device. The limit switch 144 is disposed in the power supply housing 11, and is configured to output a third detection signal when the power receiving head 2 is detected, and output a fourth detection signal when the power receiving head 2 is not detected. The control circuit 142 is connected to the output end of the limit switch 144 and the control end of the switching element 13, and is configured to control the switching element 13 to be turned on according to the third detection signal, and is configured to control the switching element 13 to be turned off according to the fourth detection signal.

The limit switch 144 may be a contact limit switch. For example, the limit switch 144 may include a contact head and a switch circuit. A micro switch is provided on the switch circuit, and the contact head is connected to the micro switch. When the power receiving head 2 moves to contact with the contact head, the contact head will make the micro switch conductive, so that the switch circuit outputs the third detection signal. When the power receiving head is not in contact with the contact head, the micro switch will remain in the turn-off state, causing the switch circuit to output a fourth detection signal. Of course, the limit switch 144 may also be a contactless limit switch, such as a reed limit switch, a photoelectric limit switch, an inductive limit switch or other types of limit switches, which is not specifically limited by the present disclosure.

In another embodiment, the control component 14 may include a control circuit 142, a light detector 141 used as the detection device, and a limit switch 144 used as the detection device. The light detector 141 is configured to output a first detection signal when receiving the detection light emitted from the power receiving head 2, and is configured to output a second detection signal when not receiving the detection light emitted from the power receiving head 2. The limit switch 144 is disposed in the power supply housing 11, and is configured to output a third detection signal when the power receiving head 2 is detected, and output a fourth detection signal when the power receiving head 2 is not detected. The input end of the control circuit 142 is connected to the output end of the light detector 141 and the output end of the limit switch 144, and the output end of the control circuit 142 is connected to the control end of the switching element 13. The control circuit 142 is configured to control the switching element 13 to be turned on according to the first detection signal and the third detection signal, and control the switching element 13 to be turned off according to the second detection signal and the fourth detection signal.

The control circuit 142 may control the switching element 13 to be turned on when receiving the first detection signal and the third detection signal, and control the switching element 13 to be turned off under other conditions. As such, the conduction of the switching element 13 needs to satisfy two control conditions: the light detector 141 detects the detection light and the limit switch 144 detects the power receiving head 2. In this way, the power supply socket 1 can be prevented from being conducted due to the ambient light or accidental pressing of the limit switch 144, thereby improving the safety of the power supply socket 1.

Figure 2:
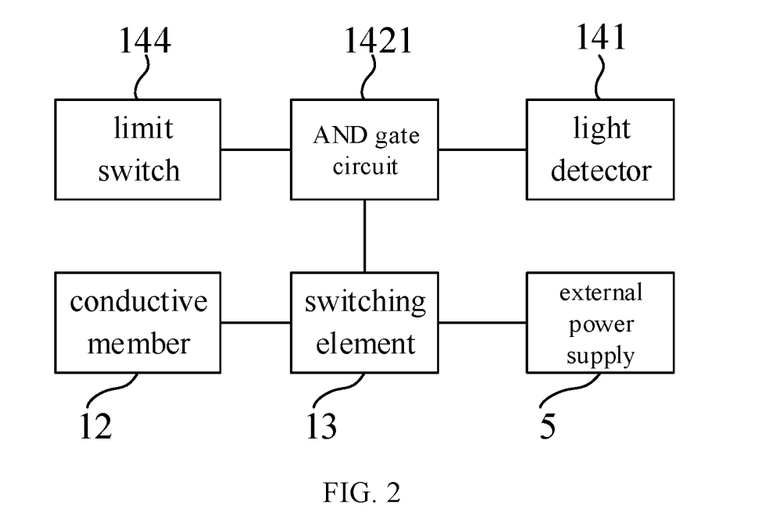
FIG. 2 is a schematic diagram showing a principle of a power supply socket according to an embodiment of the present disclosure.

In a further exemplary embodiment, as shown in FIG. 2, the control circuit 142 may include an AND gate circuit 1421. A first input end of the AND gate circuit 1421 is configured to receive the first detection signal or the second detection signal, a second input end of the AND gate circuit 1421 is configured to receive the third detection signal or the fourth detection signal, and an output end of the AND gate circuit 1421 is connected to the control end of the switching element 13. The AND gate circuit 1421 is configured to control the switching element 13 to be turned on when receiving the first detection signal and the third detection signal at the same time.

For example, the first detection signal and the third detection signal may be at a high level (logic 1), and the second signal and the fourth signal may be at a low level (logic 0). Only when both input ends of the AND gate circuit 1421 are 1, a high level control signal (logic 1) is output; otherwise, a low level control signal (logic 0) is output. The high-level control signal (logic 1) is configured to control the switching element 13 to be turned on, and the low-level control signal (logic 0) is configured to control the switching element 13 to be turned off In this embodiment, the control circuit 142 does not need to use a controller such as an MCU (micro control unit), a CPU (central processing unit), an FPGA (field programmable gate array), or a SOC (On-Chip System). The circuit structure is simple and the cost of the power supply socket 1 is reduced.

It can be understood that the present disclosure provides embodiments with different detection devices, that is, the detection device is a combination of the light detector 141 and the limit switch 144, the detection device is the light detector 141 and the detection device is the limit switch 144. The above embodiment is merely an example for explaining the detection device and the control component 14. The detection device may also be other types of detection devices, such as a magnetic field detector, an ultrasonic detector, or a combination of a variety of different types of devices, as long as it can realize the detection of the power receiving head.

Figure 5:
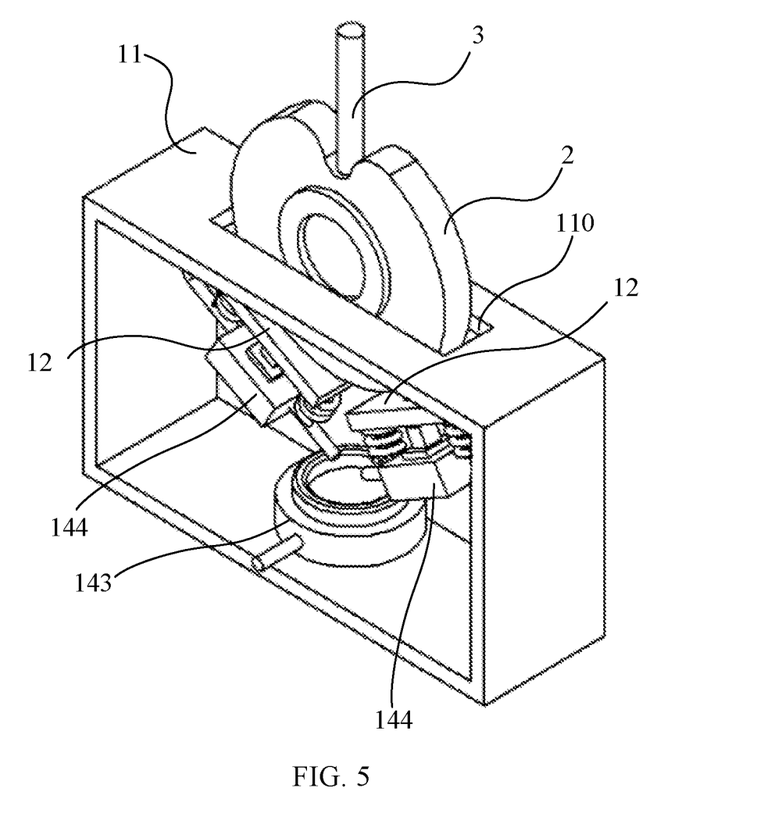
FIG. 5 is a schematic diagram showing cooperation between a power supply socket and a power receiving head according to an embodiment of the present disclosure.

In an embodiment, as shown in FIG. 1 and FIG. 5, the power supply socket housing 11 may have a power supply socket slot 110 to enable the power receiving head 2 to be inserted. The light detector 141, the conductive member 12, and the limiter switch 144 are disposed in the power supply socket slot 110 and are less likely to be damaged under the protection of the power supply socket housing 11. Moreover, the ambient light irradiated on the light detector 141 will be less or weaker, which reduces the possibility of the light detector 141 outputting the first control signal due to the ambient light. The limit switch 144 does not protrude from the outer contour of the power supply housing 11, and is not easily pressed by a foreign object to output the third control signal. The conductive member 12 does not protrude from the outer contour of the power supply housing 11, so that it is more difficult for foreign objects to touch the conductive member 12 to cause the risk of electric shock. Therefore, the safety of the power supply socket 1 is further improved.

Figure 3:
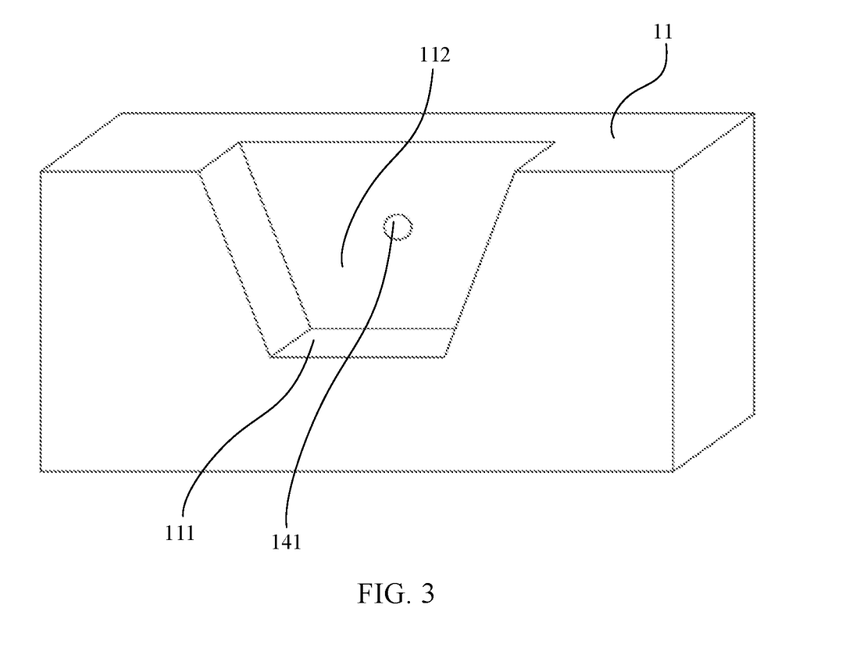
FIG. 3 is a schematic structural diagram of a power supply socket housing according to an embodiment of the present disclosure.

In an embodiment, as shown in FIG. 3, the power supply seat slot 110 is a trapezoidal slot, and the size of the slot opening is larger than the slot bottom 111. When the power supply socket 1 is installed, as shown in FIG. 8, the slot opening of the power supply socket 1 can be upward and the slot bottom 111 of the power supply socket 1 can be down. As such, the power receiving head 2 can be inserted into the power supply slot under the action of gravity.

In an embodiment, as shown in FIG. 3, the power supply socket slot 110 may include a slot opening, a slot bottom 111 disposed opposite the slot opening, and side walls 112 connecting the slot opening and the slot bottom 111. The power supply socket slot 110 further includes an open side, which is connected to the slot opening, the side walls 112 and the slot bottom 111, and the open side can allow the power receiving head 2 to enter at least partially into the power supply socket slot 110 in a posture of fitting with the power supply socket slot 110. In another embodiment, when the power receiving head 2 is inserted into the power supply socket slot 110, an orthographic projection of the portion of the power receiving head 2 inserted into the power supply socket slot 110 on the plane on which the open side is located within the open side. When the power supply socket slot 110 is installed, you can make the slot opening upward and the open side horizontally outward. As such, the power supply socket slot 110 includes two openings (i.e., the slot opening and the open side) for the power receiving head 2 to move in, which can make the mating process between the power receiving head 2 and the power supply socket slot 110 more flexible.

In one embodiment, as shown in FIGS. 3 and 4, the light detector 141 is disposed on the sidewall 112 of the power supply socket slot 110. As such, the detection light needs to be incident into the light detector 141 in a direction perpendicular to or approximately perpendicular to the direction that the power receiving head 2 is inserted, so that the light detector 141 can better position the insertion depth of the power receiving head 2. Furthermore, the number of the side walls 112 of the power supply socket 1 is more than one, and the light detector 141 is disposed on the side wall 112 disposed opposite to the open side.

It can be understood that the power receiving head housing 21 that is mated with the power supply socket 1 can be at least partially insertable into the power supply socket slot 110. As shown in FIG. 6, the power receiving head housing 21 has a mating surface 211 that mates with a side wall 112 of the power supply socket slot 110 where the light detector 141 is provided. The light emitter 23 is disposed on the mating surface 211, so that the detection light emitted by the light emitter 23 can be irradiated onto the light detector 141.

In an embodiment, as shown in FIG. 1, the magnet 143 is disposed in the power supply socket housing 11 and is located below the power supply socket slot 110. As such, the magnet 143 is disposed in a direction in which the power receiving head 2 is inserted into the power supply socket slot 110. The strength of the magnetic field detected by the magnetic field detector 24 increases as the depth of the power receiving head 2 being inserted into the power supply socket slot 110 increases, which improves the stability of the magnetic field detection 24 controlling the light emitting of the light emitter 23 according to the magnetic field, and improves the power supply stability of the power supply socket 1. Correspondingly, as shown in FIG. 6, the power receiving head 2 has an end surface 212 that mates with the slot bottom 111, and the magnetic field detector 24 is disposed near the end surface 212.

In one embodiment, as shown in FIG. 5, the conductive member 12 is disposed on the limit switch 144. When the power supply socket 1 and the power receiving head 2 mate with each other, the conductive member 12 is located between the limit switch 144 and the power receiving head 2. For example, the conductive member 12 is disposed on the contact head of the limit switch 144. As such, the power receiving head 2 transmits the pressure to the limit switch 144 through the conductive portion 22 and the conductive member 12 to ensure that when the limit switch 144 is turned on, the conductive portion 22 and the conductive member 12 are in a compressed state. When the contact failure occurs between the conductive portion 22 and the conductive member 12 because the conductive portion 22 and the conductive member 12 are not tightly compressed, the power receiving head 2 cannot effectively press the limit switch 144, so that the limit switch 144 is not turned on, and the power supply socket 1 is in a power-off state. The danger caused by the conductive portion 22 and the conductive member 12 conducting electricity when the contact is poor is avoided.

Of course, the conductive member 12 may also be disposed at other positions, for example, directly or indirectly on the power supply socket housing 11, as long as the conductive member 12 can be connected to the conductive portion 22 of the power receiving head 2.

The present disclosure also provides a power receiving head 2 for mating with the power supply socket 1 described in the above embodiments. As shown in FIGS. 6 and 7, the power receiving head 2 includes a power receiving head housing 21 and a conductive portion 22. The conductive portion 22 is provided on the power receiving head housing 21 and can be connected to the conductive member 12 on the power supply socket 1.

In an embodiment, the power receiving head housing 21 may be disposed above the power supply socket 1 so as to move downward to mate with the power supply socket 1 under the action of gravity, so that the conductive portion 22 can realize the connection with the conductive member 12 by means of the gravity of the power receiving head housing 21. Of course, the power receiving head housing 21 can also achieve movement to the power supply socket 1 and mate with the power supply socket 1 by means of other forces, for example, a magnetic attraction, an air pressure, and the like.

In an embodiment, as shown in FIG. 6 and FIG. 7, when the power supply socket 1 has the light detector 141, the power receiving head 2 further includes the light emitter 23, and the light emitter 23 is provided in the power receiving head housing 21 and configured to emit the detection light which can be received by the light detector 141.

In an embodiment, as shown in FIG. 6 and FIG. 7, when the power supply socket 1 has the magnet 143, the power receiving head 2 further includes the magnetic field detector 24. The magnetic field detector 24 is provided in the power receiving head housing 21 and connected to the light emitter 23 and configured to control the light emitter 23 to emit light when the magnetic field generated by the magnet 143 is detected, and control the light emitter 23 not to emit light when the magnetic field generated by the magnet 143 is not detected.

In one embodiment, when the power supply socket 1 has the limit switch 144, the power receiving head 2 is configured to be in contact with the limit switch 144 so that the limit switch 144 can detect the power receiving head 2. Of course, when the limit switch is the contactless limit switch, the power receiving head 2 may be configured for moving into the detection range of the limit switch, so that the limit switch 144 can detect the power receiving head 2.

In an embodiment, as shown in FIGS. 6 and 7, when the power supply socket 1 has the power supply socket slot 110 and the light detector 141 is disposed on the side wall 112 of the power supply socket slot 110, the power receiving head housing 21 can at least partially be inserted into the power receiving socket slot 110. The power receiving head housing 21 has the mating surface 211 that mate with the side wall 112 of the power supply socket slot 110 where the light detector 141 is provided. The light emitter 23 is disposed on the mating surface 211.

The specific details and beneficial effects of the power receiving head 2 provided by the present disclosure have been described in detail in the above-mentioned embodiments of the power supply socket 1, and the present disclosure will not repeat them here.

The present disclosure also provides a power supply device. As shown in FIG. 8, the charging device includes a power supply socket 1, a power receiving head 2, a wire 3, and a wire retractable mechanism 4.

The power supply socket 1 is the power supply socket 1 described in the above embodiments of the power supply socket 1. The power receiving head 2 is the power receiving head 2 described in the above embodiment of the power receiving head 2. The wire 3 is connected to the conductive portion 22 of the power receiving head 2. The wire retractable mechanism 4 is used for retracting or releasing the wire 3. When the wire 3 is released, the power receiving head 2 can contact the power supply socket 1, so that the conductive portion 22 is connected to the conductive member 12.

As such, when the supplying of power is required, the wire retractable mechanism 4 is controlled to releases the wire 3, the power receiving head 2 can be moved to mate with the power supply socket 1, and the conductive member 12 of the power supply socket 1 is connected to the conductive portion 22 of the power receiving head 2. At this time, the power supply socket 1 detects the power receiving head 2 and the internal switching element 13 is turned on, so that the wire 3 is electrically connected to the external power source 5 through the power receiving head 2 and the power supply socket 1. When supplying of power is not required, the wire retractable mechanism 4 is controlled to receive the wire 3, the power receiving head 2 moves under the pulling force of the wire 3, the conductive member 12 of the power supply socket 1 is separated from the conductive portion 22 of the power receiving head 2, and the wire 3 is not connected to the external power source 5. At this time, the wire 3 can be housed in the wire retractable mechanism 4 to avoid exposure to the environment to affect the layout.

Therefore, the purpose of controlling the connection or disconnection between the control wire 3 and the external power source 5 is achieved by controlling the wire retractable mechanism 4 to receive or release the wire 3. The power supply socket 1 of the power supply device of the present disclosure is the power supply socket 1 described in the above embodiments of the power supply socket 1. The power receiving head 2 is the power receiving head 2 described in the above embodiments of the power receiving head 2, and therefore has the same beneficial effects. The present disclosure does not specifically limit this.

In an embodiment, the wire 3 is connected to the conductive portion 22 of the power receiving head 2 and makes the power receiving head 2 to be located above the power supply socket 1. When the wire retractable mechanism 4 releases the wire 3, the power receiving head 2 is in contact with the power supply socket 1 under the action of the gravity, so that the conductive portion 22 is connected to the conductive member 12.

In an embodiment, as shown in FIG. 8, the wire retractable mechanism 4 may include a winding roll and a motor, and the wire 3 is at least partially wound on the winding roll. When the motor drives the winding roll to rotate, the winding roll can retract (i.e., accommodate) or release the wires 3.

The power supply device can directly provide electricity to electronic devices such as televisions, display screens, and electronic picture screens, and can also charge batteries of electronic devices such as televisions, display screens, and electronic picture screens.

In one embodiment, the power supply device is configured to charge the battery. The power supply device may further include a charging component, a charging detection component, and a charging control component 14. The charging component is connected to the battery and the wire 3 for charging the battery with the external power source 5. The charging detection component is configured to detect the battery level and send the detection result to the charging control component 14. The charging control component 14 is connected to the charging detection component and the wire retractable mechanism 4 for releasing the wire 3 when the battery level is lower than the first set value, so that the power receiving head 2 mates with the charging base, so that the external power source 5 charges the battery; and the charging control component 14 is further configured to receive the wire 3 when the battery level is higher than the second set value, so that the power receiving head 2 is separated from the charging base to avoid overcharging the battery. As such, the power supply device can automatically charge the battery.

The present disclosure also provides a power supply method, which is applied to the above-mentioned power supply device. The power supply method includes the following steps:

controlling the wire retractable mechanism 4 to release the wire 3 when supplying of power is required, so that the conductive member 12 of the power supply socket 1 is connected to the conductive portion 22 of the power receiving head 2;

controlling the wire retractable mechanism 4 to retract the wire 3 when supplying of power is not required, so that the conductive member 12 of the power supply socket 1 is separated from the conductive portion 22 of the power receiving head 2.

The principle and beneficial effects of the power supply method provided by the present disclosure have been described in detail in the above-mentioned embodiments of the power supply device, and the present disclosure will not repeat them here.

The present disclosure also provides a display device including the power supply device described in the above embodiment of the power supply device. The display device may be an electronic picture screen, a wall-mounted television, a wall-mounted display, an electronic billboard, or other display devices, which are not specifically limited in The present disclosure.

The power supply device of the display device of the present disclosure is the same as the power supply device described in the embodiments of the power supply device described above, and thus has the same beneficial effects, which will not be repeated here.

Figure 9:
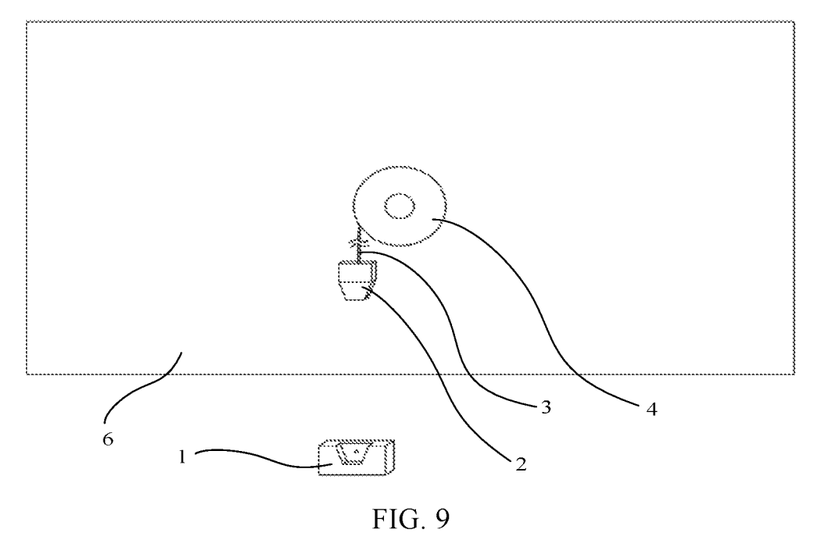
FIG. 9 is a schematic rear structural view of a drawing screen according to an embodiment of the present disclosure.
Figure 10:
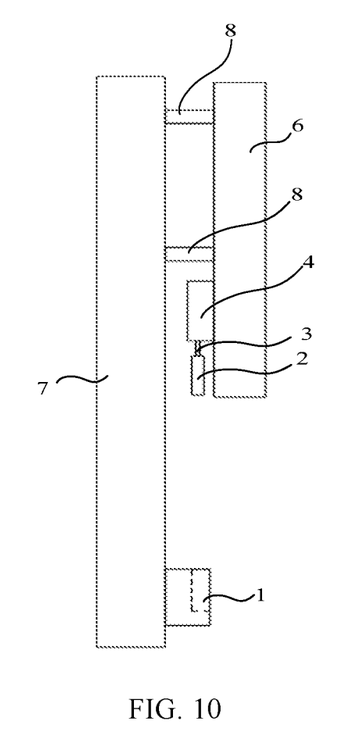
FIG. 10 is a schematic side structural view of a drawing screen according to an embodiment of the present disclosure.

The present disclosure also provides a picture screen, as shown in FIG. 9 and FIG. 10. The picture screen includes a display panel 6 and the power supply device described in the foregoing power supply device embodiments. The display panel 6 has a light emitting surface and the wire retractable mechanism 4 of the power supply device is disposed on a side of the display panel 6 away from the light emitting surface. As such, the wire retractable mechanism 4 is disposed behind the display panel 6 and is blocked by the display panel 6 without affecting the layout of the picture screen. This prevents the wire retractable mechanism 4 from blocking the display panel 6 and reducing the display effect and affecting appearance of the picture screen. The power supply device for the picture screen of the present disclosure is the same as the power supply device described in the embodiments of the power supply device described above, and therefore has the same beneficial effects, which will not be repeated here.

In an embodiment, as shown in FIG. 9 and FIG. 10, after the wire retractable mechanism 4 receives the wire 3, the power receiving head 2 moves to a position close to the wire retractable mechanism 4 under the pulling force of the wire 3. Orthographic projections of the wire retractable mechanism 4 and the power receiving head 2 on the display panel 6 are within the display panel 6. As such, when the power supply device does not provide electricity power to the display panel 6, the display panel 6 can completely shield the wire retractable mechanism 4, the wire 3, and the power receiving head 2, thereby avoiding affecting the installation effect of the screen by the wire retractable mechanism 4, the wire 3, or the power receiving head 2.

In one embodiment, as shown in FIG. 10, the screen can be mounted on the support wall 7 in a wall-mounted manner through the connecting member 8. The connecting member 8 may be a hanger, a fastening bolt, or other feasible connecting components; the supporting wall 7 may be a wall, a side wall of a cabinet, a screen, or other structures that can be used to support a picture screen. When the picture screen is mounted on the support wall 7, the power supply socket 1 can be disposed on the support wall 7 and below the wire retractable mechanism 4 so that the power receiving head 2 can move to the power supply socket 1 under the action of gravity and finally mates with the power supply socket 1.

In one embodiment, the picture screen further includes a housing, the display panel 6 may be disposed inside the housing, and the wire retractable mechanism 4 may be disposed outside the housing. According to an embodiment, when the picture screen is fixed on the support wall 7, the wire retractable mechanism 4 is located at the center of the housing or near the center of the housing along the horizontal direction to improve the stability of the picture screen.

It should be understood that the present disclosure is not limited to the detailed structure and arrangement of the components proposed by the present specification. The present disclosure is capable of having other embodiments, and be carried out and implemented in various manners. The foregoing variations and modifications fall within the scope of the present disclosure. It should be understood that the present disclosure disclosed and defined by the present specification extends to all alternative combinations of two or more of the individual features apparent or recited herein and/or in the drawings. All of these various combinations constitute a number of alternative aspects of the present disclosure. The embodiments described in the present specification are illustrative of the best mode for carrying out the present disclosure and will enable those skilled in the art to utilize the present disclosure.

What is claimed is:

1. A power supply socket, comprising:
a power supply socket housing;
a conductive member provided in the power supply socket housing and connectable with a conductive portion on a power receiving head;
a switching element provided in the power supply socket housing and having an output end and a control end, wherein the output end of the switching element is connected to the conductive member; and
a control component provided in the power supply socket housing and connected to the control end of the switching element, and configured to detect the power receiving head, and control the switching element to be turned on when the control component detects the power receiving head, and control the switching element to be turned off when the control component does not detect the power receiving head.

2. The power supply socket according to claim 1, wherein the switching element further has an input end which is configured for being connected to an external power supply.

3. The power supply socket according to claim 1, wherein the control component comprises:
a limit switch provided in the power supply socket housing and configured to output a third detection signal when the power receiving head is detected, and output a fourth detection signal when the power receiving head is not detected; and
a control circuit connected to an output end of the limit switch and the control end of the switching element, and configured to control the switching element to be turned on according to the third detection signal, and control the switching element to be turned off according to the fourth detection signal.

4. The power supply socket according to claim 3, wherein, when the power supply socket is mated with the power receiving head, the conductive member is located between the limit switch and the power receiving head.

5. The power supply socket according to claim 1, wherein the control component comprises:
a light detector configured to output a first detection signal when detection light emitted from the power receiving head is received, and output a second detection signal when the detection light emitted from the power receiving head is not detected; and
a control circuit connected to an output end of the light detector and the control end of the switching element, and configured to control the switching element to be turned on according to the first detection signal, and control the switching element to be turned off according to the second detection signal.

6. The power supply socket according to claim 5, wherein the control component further comprises:
a magnet provided in the power supply socket housing and configured to generate a magnetic field, wherein the power receiving head is configured for responding to the magnetic field and the magnetic field causes the power receiving head to emit the detection light.

7. The power supply socket according to claim 6, wherein the control component further comprises:
a limit switch provided in the power supply socket housing and configured to output a third detection signal when the power receiving head is detected, and output a fourth detection signal when the power receiving head is not detected;
wherein the control circuit is further connected to an output end of the limit switch, and is configured to control the switching element to be turned on according to the first detection signal and the third detection signal, and control the switching element to be turned off according to the second detection signal and the fourth detection signal.

8. The power supply socket according to claim 7, wherein:
the control circuit comprises an AND gate circuit, a first input end of the AND gate circuit is configured to receive the first detection signal or the second detection signal, a second input end of the AND gate circuit is configured to receive the third detection signal or the fourth detection signal, and an output end of the AND gate circuit is connected to the control end of the switching element; and
the AND gate circuit is configured to control the switching element to be turned on when receiving the first detection signal and the third detection signal simultaneously.

9. The power supply socket according to claim 7, wherein:
the power supply socket housing has a power supply socket slot for inserting the power receiving head; and
the light detector, the conductive member, and the limit switch are disposed in the power supply socket slot.

10. The power supply socket according to claim 9, wherein the light detector is disposed on a side wall of the power supply socket slot.

11. A power receiving head for mating with a power supply socket, wherein:
the power supply socket comprises:
a power supply socket housing;
a conductive member provided in the power supply socket housing and connectable with a conductive portion on a power receiving head;
a switching element provided in the power supply socket housing and having an output end and a control end, wherein the output end of the switching element is connected to the conductive member; and
a control component provided in the power supply socket housing and connected to the control end of the switching element, and configured to detect the power receiving head, and control the switching element to be turned on when the control component detects the power receiving head, and control the switching element to be turned off when the control component does not detect the power receiving head; and
the power receiving head comprises:
a power receiving head housing; and
a conductive portion provided in the power receiving head housing, and connectable to a conductive member on the power supply socket.

12. The power receiving head according to claim 11, wherein, when the power supply socket has a limit switch, and the power receiving head is configured to be in contact with the limit switch.

13. The power receiving head according to claim 11, wherein:

when the power supply socket has a power supply socket slot, and the light detector is disposed on a side wall of the power supply socket slot, the power receiving head housing is at least partially insertable into the power supply socket slot;

the power receiving head housing has a mating surface that mates with a side wall of the power supply socket slot where the light detector is provided; and the light emitter is disposed on the mating surface.

14. The power receiving head according to claim 11, wherein, when the power supply socket has a light detector, the power receiving head further comprises: a light emitter provided in the power receiving head housing and configured to emit detection light receivable by the light detector.

15. The power receiving head according to claim 14, wherein, when the power supply socket has a magnet, the power receiving head further comprises:

a magnetic field detector provided in the power receiving head housing and connected to the light emitter, and configured to control the light emitter to emit light when a magnetic field generated by the magnet is detected, and control the light emitter not to emit light when a magnetic field generated by the magnet is not detected.

16. A power supply device, comprising:

a power supply socket, comprising:

a power supply socket housing;

a conductive member provided in the power supply socket housing and connectable with a conductive portion on a power receiving head;

a switching element provided in the power supply socket housing and having an output end and a control end, wherein the output end of the switching element is connected to the conductive member; and a control component provided in the power supply socket housing and connected to the control end of the switching element, and configured to detect the power receiving head, and control the switching element to be turned on when the control component detects the power receiving head, and control the switching element to be turned off when the control component does not detect the power receiving head;

the power receiving head according to claim 11;

a wire connected to a conductive portion of the power receiving head; and a wire retractable mechanism configured to retract or release the wire, wherein the power receiving head is in contact with the power supply socket when the wire is released, so that the conductive portion is connected with the conductive member.

17. A display device comprising a display panel and the power supply device according to claim 16, wherein the display panel has a light emitting surface, and the wire retractable mechanism of the power supply device is disposed on a side of the display panel away from the light emitting surface.

* * * * *